United States Patent
Oshita et al.

(10) Patent No.: US 11,507,030 B2
(45) Date of Patent: Nov. 22, 2022

(54) TIMEPIECE, METHOD FOR CONTROLLING TIMEPIECE, AND STORAGE MEDIUM

(71) Applicant: CASIO COMPUTER CO., LTD., Tokyo (JP)

(72) Inventors: Yuki Oshita, Tokyo (JP); Katsuhiko Obata, Fussa (JP); Akihiro Kuroha, Fussa (JP)

(73) Assignee: CASIO COMPUTER CO., LTD., Tokyo (JP)

(*) Notice: Subject to any disclaimer, the term of this patent is extended or adjusted under 35 U.S.C. 154(b) by 422 days.

(21) Appl. No.: 16/124,237

(22) Filed: Sep. 7, 2018

(65) Prior Publication Data
US 2019/0094818 A1 Mar. 28, 2019

(30) Foreign Application Priority Data

Sep. 26, 2017 (JP) .............................. JP2017-184392

(51) Int. Cl.
G04R 20/04 (2013.01)
G04G 21/04 (2013.01)
G01R 31/3835 (2019.01)
G04B 47/06 (2006.01)

(52) U.S. Cl.
CPC ............ G04R 20/04 (2013.01); G04G 21/04 (2013.01); G01R 31/3835 (2019.01); G04B 47/068 (2013.01)

(58) Field of Classification Search
CPC ...... G04R 20/04; G04R 20/02; G04B 47/068; G04G 21/04; G01B 31/36
See application file for complete search history.

(56) References Cited

U.S. PATENT DOCUMENTS

| 6,212,133 B1* | 4/2001 | McCoy | G01S 19/34 342/357.43 |
| 7,974,155 B2* | 7/2011 | Matsuzaki | G04R 20/04 368/47 |
| 9,804,574 B2* | 10/2017 | Honda | G04G 19/08 |

(Continued)

FOREIGN PATENT DOCUMENTS

| CN | 101344757 A | 1/2009 |
| JP | 2009-036749 A | 2/2009 |

(Continued)

OTHER PUBLICATIONS

First Office Action dated May 26, 2020 received in Chinese Patent Application No. CN 201811125671.5 together with an English language translation.

(Continued)

Primary Examiner — Sean Kayes
(74) Attorney, Agent, or Firm — Scully, Scott, Murphy & Presser, P.C.

(57) ABSTRACT

A timepiece including a GPS receiver that receives a radio wave from a positioning satellite, a time counter that performs a time count operation, and a processor, the processor being configured to: corrects a time count of the time counter in accordance with time and date information included in the radio wave from the positioning satellite received by the GPS receiver; acquires a temperature in the timepiece; acquires a voltage of a battery; and controls a receive operation at the GPS receiver in accordance with the temperature and the voltage.

5 Claims, 3 Drawing Sheets

(56) References Cited

U.S. PATENT DOCUMENTS

| | | | |
|---|---|---|---|
| 2009/0315763 A1 | 12/2009 | Matsuzaki | |
| 2015/0268638 A1* | 9/2015 | Hasegawa | G04C 3/14 |
| | | | 368/47 |
| 2017/0038742 A1* | 2/2017 | Honda | G04R 20/04 |
| 2017/0179967 A1* | 6/2017 | Maki | G01S 19/37 |
| 2017/0255167 A1* | 9/2017 | Yamazaki | G04G 3/04 |

FOREIGN PATENT DOCUMENTS

| | | |
|---|---|---|
| JP | 2010-230372 A | 10/2010 |
| JP | 2013-181915 A | 9/2013 |
| JP | 2017-036964 A | 2/2017 |
| JP | 2018-169298 A | 11/2018 |

OTHER PUBLICATIONS

Extended European Search Report dated Feb. 15, 2019 received in European Patent Application No. EP 18192890.4.

Notice of Reasons for Refusal dated Aug. 24, 2021 received in Japanese Patent Application No. JP 2017-184392 together with an English language translation.

* cited by examiner

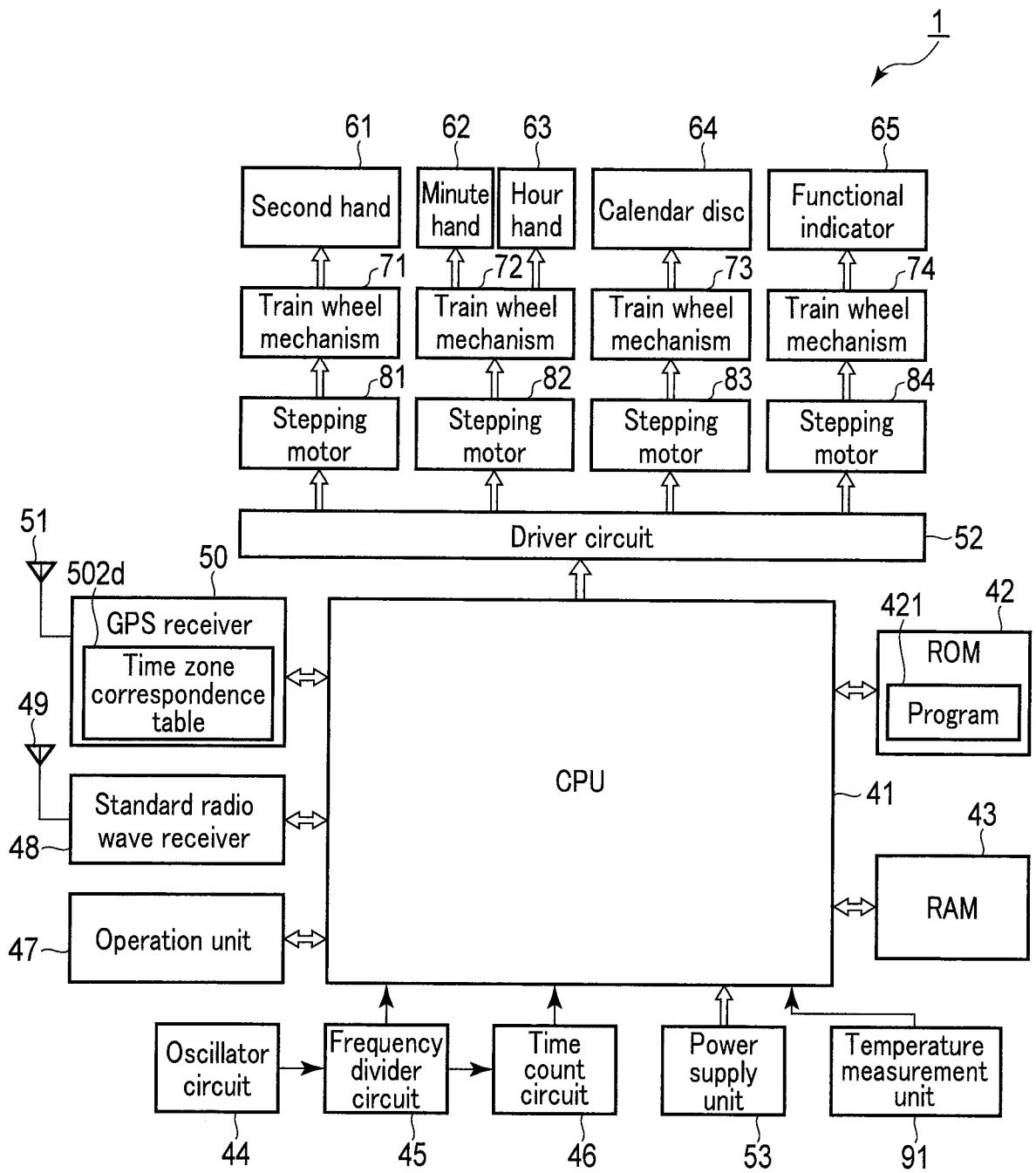
F I G. 1

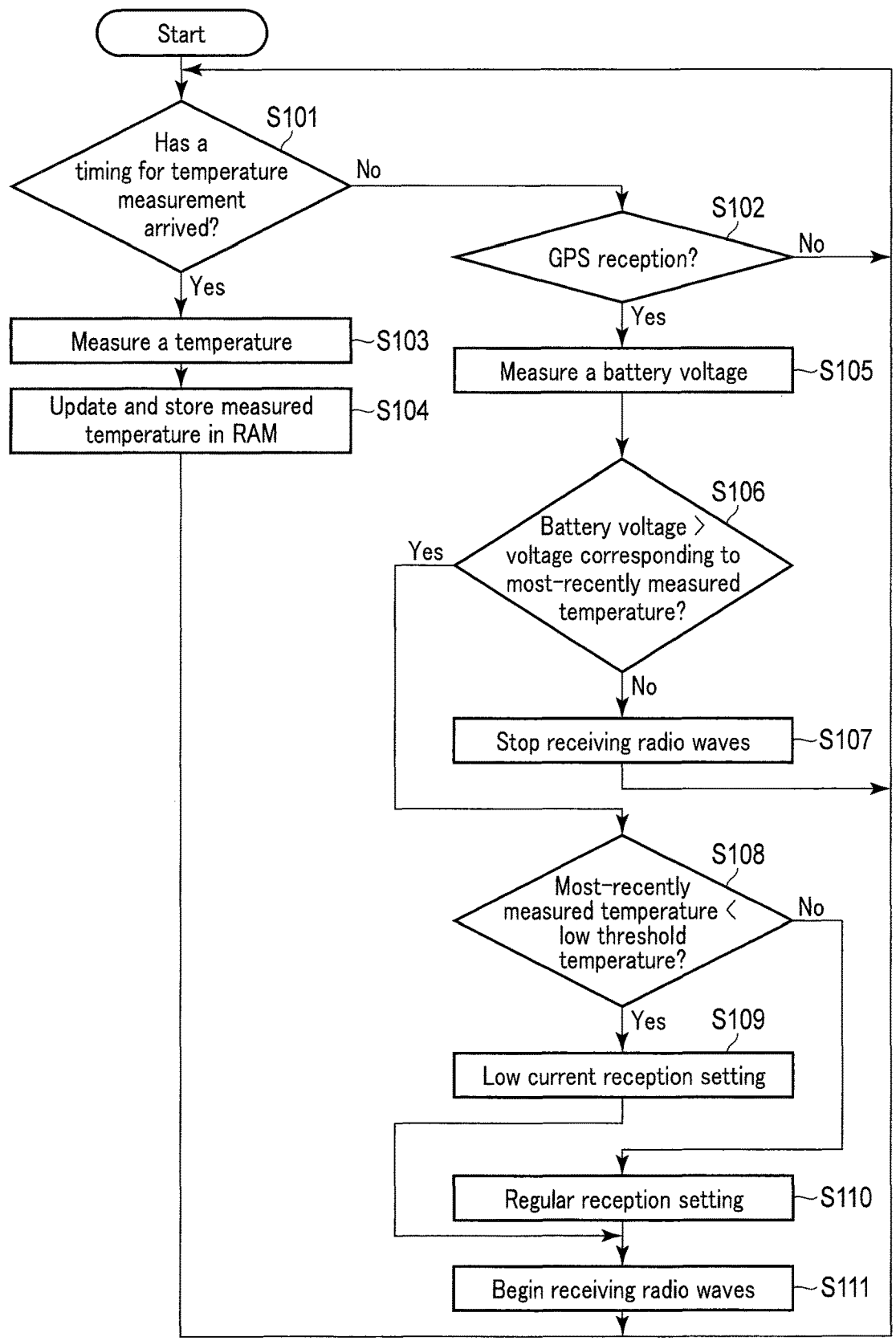
F I G. 2

| Temperature [°C] | Voltage [V] |
|---|---|
| −20 ≦ Temp < −15 | |
| −15 ≦ Temp < −10 | |
| −10 ≦ Temp < −5 | |
| −5 ≦ Temp < 0 | |
| 0 ≦ Temp < 5 | |
| ⋮ | ⋮ |
| 45 ≦ Temp < 50 | |
| 50 ≦ Temp < 55 | |
| 55 ≦ Temp < 60 | |

F I G. 3

TIMEPIECE, METHOD FOR CONTROLLING TIMEPIECE, AND STORAGE MEDIUM

CROSS-REFERENCE TO RELATED APPLICATIONS

This application is based upon and claims the benefit of priority from prior Japanese Patent Application No. 2017-184392, filed Sep. 26, 2017, the entire contents of which are incorporated herein by reference.

BACKGROUND OF THE INVENTION

1. Field of the Invention

The present invention relates to a timepiece that receives radio waves from positioning satellites to obtain information, a method for controlling such a timepiece and a non-transitory storage medium.

2. Description of the Related Art

A technique relating to timepieces that can carry on a regular display of as long of a time as possible by limiting loads caused by various operations including a positioning operation using the global positioning system (GPS) in accordance with a remaining battery amount has been proposed (for example, Jpn. Pat. Appln. KOKAI Publication No. 2013-181915, hereinafter "patent literature").

Various techniques relating to electronic watches using a battery with limited power capacity, including the techniques described in the above patent literature, have been proposed.

A button battery, which is widely used as a power source in a watch, has a low load characteristic, and has a limitation on an amount of current that can flow in the button battery. Since a watch having a GPS positioning function requires a large current to perform GPS positioning, a heavy load is imposed on the battery.

Furthermore, generally speaking, a load characteristic of a battery is degraded under a low temperature, and an amount of current that can flow in the battery is further limited when the temperature is low.

BRIEF SUMMARY OF THE INVENTION

A timepiece of a preferable embodiment includes the following:
a GPS receiver that receives a radio wave from a positioning satellite;
a time counter that performs a time count operation; and
a processor,
the processor being configured to:
corrects a time count of the time counter in accordance with time and date information included in the radio wave from the positioning satellite received by the GPS receiver;
acquires a temperature within the timepiece;
acquires a voltage of a battery; and
controls a receive operation at the GPS receiver in accordance with the temperature and the voltage.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute apart of the specification, illustrate embodiments of the invention, and together with the general description given above and the detailed description of the embodiments given below, serve to explain the principles of the invention.

FIG. 1 is a block diagram showing a functional configuration of a timepiece according to an embodiment.

FIG. 2 is a flowchart showing processing of temperature measurement and GPS reception.

FIG. 3 is a table of measured temperatures and corresponding battery voltages in the embodiment.

DETAILED DESCRIPTION OF THE PREFERRED EMBODIMENTS

An embodiment will be described with reference to the accompanying drawings.

FIG. 1 is a block diagram showing a functional configuration of a timepiece 1 according to the present embodiment. This timepiece 1 is a timepiece that receives radio waves from positioning satellites and uses the received radio waves.

The timepiece 1 includes a CPU 41, a ROM 42, a RAM 43, an oscillator circuit 44, a frequency divider circuit 45, a time count circuit 46, an operation unit 47, a standard radio wave receiver 48 and an antenna 49 thereof, a GPS receiver 50 and an antenna 51 thereof, a driver circuit 52, a power supply unit 53, a second hand 61, a minute hand 62, an hour hand 63, a calendar disc 64, a functional indicator 65, train wheel mechanisms 71 to 74, stepping motors 81 to 84, and a temperature measurement unit 91, etc. Hereinafter, the second hand 61, the minute hand 62, the hour hand 63, the calendar disc 64, and the functional indicator 65 may be referred to as indicators 61 to 65, individually or collectively.

The CPU 41 performs computing processing and controls the timepiece 1. The CPU 41 controls an indicator operation related to a date-and-time display, and calculates a date and time based on data received by the standard radio wave receiver 48. The CPU 41 corrects a date and time counted by the time count circuit 46 based on the obtained date and time data.

The ROM 42 stores programs 421 for various kinds of controlling processing performed by the CPU 41 and setting data. For example, the programs 421 include an operation control program for limiting functions when GPS reception begins.

The RAM 43 provides a working memory for the CPU 41, and data is temporarily stored therein.

The oscillator circuit 44 has a crystal oscillator to generate and output a predetermined frequency signal.

The frequency divider circuit 45 divides a frequency signal that is output from the oscillator circuit 44 into a signal of a frequency that is usable for the CPU 41 and the time count circuit 46, and outputs the frequency-divided signal. The frequency of the output signal may be changeable by a control signal from the CPU 41.

The time count circuit 46 counts frequency-divided signals that are input from the frequency divider circuit 45, and adds the count to an initial value indicating a predetermined date and time, thereby counting a current date and time. A date and time counted by the time count circuit 46 is correctable by a control signal from the CPU 41.

The operation unit 47 receives an input operation from a user. The operation unit 47 includes a push button switch and a rotary switch.

The standard radio wave receiver 48 receives a radio wave (standard radio wave) of a low frequency band by using the antenna 49, and the receiver 48 demodulates a time signal output (TCO) of the amplitude-modulated standard radio wave, and outputs the TCO to the CPU 41.

A tuned frequency of a low frequency band received by the standard radio wave receiver 48 is changed in accordance with a transmit frequency from a standard radio wave transmit station designated as a target for reception under the control of the CPU 41. The standard radio wave receiver 48 performs various kinds of processing for improving reception sensitivity, and converts an analog signal into a digital signal at a predetermined sampling frequency and outputs the signal to the CPU 41.

The GPS receiver 50 receives radio waves of an L1 band (1.57542 GHz) transmitted from a positioning satellite, using the antenna 51, and demodulates and decodes signals (navigation messages) from the positioning satellite to obtain date and time information and location information. The obtained information is output to the CPU 41 in a format that conforms to a standard, for example, NMEA-0182 (National Marine Electronics Associations).

The GPS receiver 50 receives information as a target for acquisition and setting data related to output formats from the CPU 41, and stores the information and setting data. The GPS receiver 50 stores predicted orbit information of a positioning satellite acquired from the positioning satellite, and can use the information as needed by reading therefrom when GPS reception is carried out. The GPS receiver 50 stores a time zone correspondence table 502*d* for acquiring a time zone and summer time information in accordance with a designated location.

The GPS receiver 50 may be further configured to be compatible with the GLONASS (Global Navigation Satellite System) and the QZSS (Quasi-Zenith Satellite System), and to be capable of receiving radio waves that arrive from those satellite systems.

Upon input of a control signal from the CPU 41, the driver circuit 52 outputs a driving signal to the stepping motors 81-84 at an appropriate timing in accordance with the control signal, and drives the stepping motors 81-84 to rotate. In the driver circuit 52, it is possible to adjust a pulse width of a driving signal and a driving voltage as needed based on a setting that is input from the CPU 41.

In order to avoid a large load being applied all at once, when a control signal for simultaneously driving the multiple stepping motors is input, the driver circuit 52 shifts timing of driving these stepping motors with micro intervals, so that the times to start driving the motors do not overlap.

The power supply unit 53 supplies power at a predetermined voltage required for operations at each unit. The power supply unit 53 has a battery, and a changeable button-type dry battery is typically used. As another example, a solar panel and a secondary battery may be used as a battery. To supply power at different voltages, the power supply unit 53 may convert a voltage output from the battery into a predetermined voltage using, for example, a switching power supply.

Furthermore, a voltage measurement means for measuring a voltage generated in the battery is incorporated in the power supply unit 53 for the purpose of battery control. The CPU 41 may measure a voltage of the battery.

The stepping motor 81 rotates the second hand 61 via the train wheel mechanism 71, which is an arrangement of a plurality of gears. When the stepping motor 81 is driven for one time, the second hand 61 turns for 6° in one step, and makes one revolution on the dial by 60 operation cycles of the stepping motor 81.

The stepping motor 82 rotates the minute hand 62 and the hour hand 63 via the train wheel mechanism 72. The train wheel mechanism 72 is a structure for rotating the hour hand 63 in conjunction with the minute hand 62, and it rotates the minute hand 62 by 1° per 10 seconds, and the hour hand 63 by $\frac{1}{12}$° per 10 seconds.

The stepping motor 83 rotates the calendar disc 64 with the train wheel mechanism 73. Although the calendar disc 64 is not particularly limited by the example described herein, the calendar disc 64 is rotatably arranged below (behind) and parallel to the dial for an indicator display of the timepiece 1. An opening is provided in the dial, and indicators of each date, from a first to thirty first day, are provided on the circumference of the calendar disc 64 on the side that faces the opening, and one of the indicators is exposed through the opening as the calendar disc 64 rotates. When the stepping motor 83 is driven for one time, the calendar disc 64 moves by a certain angle corresponding to one step, and moves by (360/361°) in 150 steps; as a result, the date indicator exposed through the opening on the dial is changed for one day. Then, when the calendar disc 64 rotates for 31 days, the date indicator indicating the first day is once again exposed through the opening.

The stepping motor 84 rotates the functional indicator 65 with the train wheel mechanism 74. Although not limited to this example, the functional indicator 65 revolves, for example, about a rotation axis different from those of the second hand 61, the minute hand 62, the hour hand 63, and the calendar disc 64, and is used for displaying information other than a date and time, or types of a date and time. The train wheel mechanism 74 revolves, for example, the functional indicator 65 for the angle corresponding to "360°/the number of displayed functions" per rotation of the stepping motor 84.

The temperature measurement unit 91 has a temperature sensor that is arranged in the proximity of the battery in the power supply unit 53, and has an A/D conversion circuit that converts an output of the sensor into a digital value and outputs the value to the CPU 41 as temperature data.

Particularly, if the battery in the power supply unit 53 is composed of a lithium ion secondary battery, a temperature sensor and a circuit for A/D converting and outputting of sensor outputs are included in a control circuit which is built into the lithium ion secondary battery; in such a case, the temperature measurement unit 91 may be omitted.

Next, an operation according to the above-described embodiment will be explained.

FIG. 2 is a flowchart of a process of a temperature measurement and a determination at the time of beginning GPS reception, which are carried out by the CPU 41 along with the control of the time count operation.

At the beginning of the process, the CPU 41 determines whether a predetermined timing for temperature measurement has arrived or not by, for example, determining whether or not ten minutes has passed since the last time a temperature measurement was carried out (step S101). This predetermined timing for temperature measurement is exclusively set in accordance with a model of the clock.

If it is determined that the predetermined temperature measurement timing has not yet arrived, and a certain length of time has not yet passed since the last time a temperature was measured (No in step S101), the CPU 41 next determines whether or not reception from a GPS satellite using the GPS receiver 50 should begin or not (step S102).

This determination as to whether reception of radio waves from the GPS satellite begins or not is made when a user who wears this timepiece 1 manually operates any necessary push button switch in the operation unit 47, as well as when it is determined whether a predetermined time for reception has arrived or not.

If it is determined that reception of radio waves from the GPS satellite does not begin (No in step S102), the CPU 41 returns to step S101.

By repeating the processing in steps S101 and S102, the CPU 41 waits until the timing for temperature measurement has arrived or until the CPU 41 is ready for receiving radio waves from a GPS satellite begins, while performing a regular time count operation.

In step S101, if it is determined that ten minutes have passed since the last temperature measurement and the predetermined timing for temperature measurement has arrived (Yes in step S101), the CPU 41 causes the temperature measurement unit 91 to carry out temperature measurement (step S103).

The CPU 41 stores and updates the temperature information in the RAM 43 obtained from the temperature measurement unit 91 (step S104), and returns to a stand-by operation in step S101. Accordingly, the RAM 43 constantly stores most recent temperature measurement information that is obtained within a predetermined range of time.

In step S102, if it is determined that the reception of radio waves from a GPS satellite begins either when a predetermined reception time has arrived or when a push button switch is manually operated in the operation unit 47 (Yes in step S102), the CPU 41 causes the power supply unit 53 to measure a voltage generated in its internal battery (step S105).

The CPU 41 reads the most recent temperature measurement information stored in the RAM 43, and obtains a voltage value corresponding to the temperature measurement information from the battery voltage correspondence table for battery temperature ranges stored in the ROM 42, and determines whether or not the voltage value measured in step S105 is higher than a battery voltage of the corresponding temperature range (step S106).

FIG. 3 shows an example of the table that is read by the CPU 41 from the ROM 42. In this table it is assumed that the operation-guaranteed temperature range in the timepiece 1 is from −20° C. to 60° C., and a minimum voltage value is set for each divided temperature range, which is obtained by dividing the above temperature range by 5° C. Those minimum voltage values are determined in such a manner that performing of a computing processing for the operation of receiving radio waves from the GPS satellite does not put a load on the battery.

As widely known, a voltage generated in the battery is lowered as the temperature range becomes lower regardless of a battery consumption state, and a load is increased when the battery is driven at a large current. Accordingly, a minimum voltage required to guarantee the reception of radio waves from a GPS satellite is set at a higher value as the temperature range lowers; thus, it is possible to know a situation where the battery can withstand a processing load that the battery undergoes.

In the above-described step S106, if it is determined that a voltage value obtained by the measurement is lower than a battery voltage of a corresponding temperature range in the table of FIG. 3 (No in step S106), the CPU 41 determines to stop receiving radio waves from a GPS satellite (step S107), and returns to step S101.

In step S106, if it is determined that a voltage value obtained by the measurement is higher than a battery voltage of a corresponding temperature range in the table of FIG. 3 (Yes in step S106), the CPU 41 determines to begin receiving radio waves from a GPS satellite and determines whether or not a most-recently measured temperature is lower than a predetermined low threshold temperature, for example, +5° C. (step S108).

When it is determined that the most-recently measured temperature is equal to or lower than the predetermined low threshold temperature (Yes in step S108), the CPU 41 carries out a small current reception setting that restricts a current value required for a receive operation at the GPS receiver 50, so that the reception of radio waves from a GPS satellite begins at a small current, in order to mitigate a load on the battery (step S109).

Herein, in order to begin receiving radio waves from a GPS satellite in compliance with the small current reception setting, one or more of the following may be carried out: reduction in an operation clock at the time of searching for a GPS satellite, reduction in the number of channels that are designated as search targets during the search, reduction in time-out determination time when the search is performed, reduction in an operation clock at the time of tracking, reduction in the number of channels that are designated for capture targets when the tracking is performed, reduction in overall length of a time-out, and reduction in gain control (amplification rate) by a low noise amplifier (LNA) used on the high-frequency side of the GPS receiver 50, etc.

The CPU 41 sets a current value so as to limit a current required for the receive operation at the GPS receiver 50 so that the current consumed at the GPS receiver 50 is minimized, assuming that at least one of the above-described targets for reductions is carried out, or a combination thereof is carried out in stages in accordance with a measured temperature range.

In step S108, if it is determined that the most-recently measured temperature is equal to or higher than the predetermined low threshold temperature (No in step S108), the battery is in a state of having an allowance for a load; thus, the CPU 41 removes the above-described limitation on a current required for the receive operation at the GPS receiver 50, and carries out a setting for a regular receive operation (step S110).

Thereafter, the CPU 41 begins the operation of receiving radio waves from a GPS satellite by the antenna 51 and the GPS receiver 50 in accordance with the reception setting carried out in step S109 or in step S110 (step S111), and returns to step S101.

When more accurate information of a current date and time is obtained by receiving radio waves from a GPS satellite, the CPU 41 corrects what is counted by the time count circuit 46 based on the more accurate date and time information.

According to the above-described embodiment, it is possible to perform an operation of receiving radio waves from a positioning satellite while mitigating a load on a battery under a low temperature.

In the above-described embodiment, a reference voltage value that corresponds to a temperature range that a most-recent temperature measured by the temperature measurement unit 91 belongs to is predetermined, and this voltage value is compared with a voltage value of a battery obtained by actual measurement, and the receive operation is stopped depending on a result of the comparison, thereby reliably mitigating a load on the battery under a low temperature.

In the above-described embodiment, if a most-recently measured temperature is lower than a low threshold temperature, the receive operation at the GPS receiver 50 is at least partially inhibited, thereby restricting the operation so as to mitigate a load on a battery; thus, with a combination of this restricted operation and the control based on voltage measurement in the battery, it is possible to more reliably mitigate a load on a battery under a low temperature.

In the above embodiment, a case where mainly date and time information is obtained is only explained in relation to the receive operation in the GPS receiver 50; however, the present embodiment is not limited to such a case. For example, a wrist terminal for outdoor use, which is a wearable device with a simple navigation function, and a running watch having a GPS logger function may be configured to distinguish between a case where only date and time information is obtained and a case where both of time and date information and location information are obtained, and to restrict the receive operation as needed, taking a load on a battery into consideration based on a difference in an amount of computation in each case.

With such control on the operation, it is possible to mitigate a load on a battery, to suppress battery consumption, and to extend an operable time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A timepiece comprising:
   a global positioning system (GPS) receiver powered by a battery and configured to perform a receive operation to receive a radio wave from a positioning satellite;
   a time count circuit configured to perform a time count operation; and
   a processor, wherein the processor is configured to:
      correct a time counted in the time count operation performed by the time count circuit in accordance with date and time information included in the radio wave from the positioning satellite received by the GPS receiver;
      acquire a temperature in the timepiece;
      acquire a voltage of the battery;
      select one of a plurality of minimum voltage values corresponding to one of a plurality of temperature ranges including the temperature in the timepiece,
         wherein a voltage value of the one of the plurality of minimum voltage value increases as a temperature range value of the one of the plurality of temperature ranges decreases, and
         wherein the one of the plurality of minimum voltage values is one where reception of the radio wave from the positioning satellite is guaranteed at the corresponding one of the plurality of temperature ranges;
      perform a first comparison between the voltage of the battery and the one of the plurality of minimum voltage values corresponding to the temperature in the timepiece;
      in response to a result of the first comparison being that the voltage of the battery is equal to or less than the one of the plurality of minimum voltage values corresponding to the temperature in the timepiece, control to stop the receive operation at the GPS receiver;
      in response to the result of the first comparison being that the voltage of the battery is greater than the one of the plurality of minimum voltage values corresponding to the temperature in the timepiece:
         perform a second comparison between the temperature in the timepiece and a predetermined threshold temperature;
         in response to a result of the second comparison being a first case that the temperature in the timepiece is greater than the predetermined threshold temperature, control the receive operation at the GPS receiver so that the reception of the radio wave from the positioning satellite begins by consuming a first current; and
         in response to the result of the second comparison being a second case that the temperature in the timepiece is equal to or lower than the predetermined threshold temperature, control the receive operation at the GPS receiver so that the reception of the radio wave from the positioning satellite begins by consuming a second current lower than the first current to mitigate a load on the battery.

2. The timepiece according to claim 1,
   wherein the processor is configured to:
      in response to the result of the comparison being the first case, control the receive operation at the GPS receiver to obtain both date and time information and location information in the receive operation; and
      in response to the result of the comparison being the second case, control the receive operation at the GPS receiver to obtain only date and time information in the receive operation.

3. The timepiece according to claim 1,
   wherein the processor is configured to control the receive operation at the GPS receiver in response to the first case and the second case to control at least one of an operation frequency, a target satellite range, an operation time, an amplification rate of an amplifier that amplifies a received signal at each of times of searching and capturing the radio wave from the positioning satellite by the GPS receiver.

4. A method for controlling a timepiece, the timepiece comprising a global positioning system (GPS) receiver powered by a battery and configured to perform a receive operation to receive a radio wave from a positioning satellite, and a time count circuit configured to perform a time count operation, the method comprising:
   correcting a time counted in the time count operation performed by the time count circuit in accordance with date and time information included in the radio wave from the positioning satellite received by the GPS receiver;
   acquiring a temperature in the timepiece;
   acquiring a voltage of the battery;
   selecting one of a plurality of minimum voltage values corresponding to one of a plurality of temperature ranges including the temperature in the timepiece,
      wherein a voltage value of the one of the plurality of minimum voltage value increases as a temperature range value of the one of the plurality of temperature ranges decreases, and
      wherein the one of the plurality of minimum voltage values is one where reception of the radio wave from the positioning satellite is guaranteed at the corresponding one of the plurality of temperature ranges;

performing a first comparison between the voltage of the battery and the one of the plurality of minimum voltage values corresponding to the temperature in the timepiece;

in response to a result of the first comparison being that the voltage of the battery is equal to or less than the one of the plurality of minimum voltage values corresponding to the temperature in the timepiece, controlling to stop the receive operation at the GPS receiver;

in response to the result of the first comparison being that the voltage of the battery is greater than the one of the plurality of minimum voltage values corresponding to the temperature in the timepiece:

performing a second comparison between the temperature in the timepiece and a predetermined threshold temperature;

in response to a result of the second comparison being a first case that the temperature in the timepiece is greater than the predetermined threshold temperature, controlling the receive operation at the GPS receiver so that the reception of the radio wave from the positioning satellite begins by consuming a first current; and in response to the result of the second comparison being a second case that the temperature in the timepiece acquired is equal to or lower than the predetermined threshold temperature, controlling the receive operation at the GPS receiver so that the reception of the radio wave from the positioning satellite begins by consuming a second current lower than the first current to mitigate a load on the battery.

5. A non-transitory storage medium having stored thereon a program readable by a computer incorporated into a timepiece, the timepiece comprising a global positioning system (GPS) receiver powered by a battery and configured to perform a receive operation receive a radio wave from a positioning satellite, and a time count circuit configured to perform a time count operation, wherein the program causes the computer to at least perform:

correcting a time counted in the time count operation performed by the time count circuit in accordance with date and time information included in the radio wave from the positioning satellite received by the GPS receiver;

acquiring a temperature in the timepiece;

acquiring a voltage of the battery;

selecting one of a plurality of minimum voltage values corresponding to one of a plurality of temperature ranges including the temperature in the timepiece, wherein a voltage value of the one of the plurality of minimum voltage value increases as a temperature range value of the one of the plurality of temperature ranges decreases, and wherein the one of the plurality of minimum voltage values is one where reception of the radio wave from the positioning satellite is guaranteed at the corresponding one of the plurality of temperature ranges;

performing a first comparison between the voltage of the battery and the one of the plurality of minimum voltage values corresponding to the temperature in the timepiece;

in response to a result of the first comparison being that the voltage of the battery is equal to or less than the one of the plurality of minimum voltage values corresponding to the temperature in the timepiece, controlling to stop the receive operation at the GPS receiver;

in response to the result of the first comparison being that the voltage of the battery is greater than the one of the plurality of minimum voltage values corresponding to the temperature in the timepiece:

performing a second comparison between the temperature in the timepiece and a predetermined threshold temperature;

in response to a result of the second comparison being a first case that the temperature in the timepiece is greater than the predetermined threshold temperature, controlling the receive operation at the GPS receiver so that the reception of the radio wave from the positioning satellite begins by consuming a first current; and in response to the result of the second comparison being a second case that the temperature in the timepiece is equal to or lower than the predetermined threshold temperature, controlling the receive operation at the GPS receiver so that the reception of the radio wave from the positioning satellite begins by consuming a second current lower than the first current to mitigate a load on the battery.

* * * * *

UNITED STATES PATENT AND TRADEMARK OFFICE
CERTIFICATE OF CORRECTION

PATENT NO. : 11,507,030 B2
APPLICATION NO. : 16/124237
DATED : November 22, 2022
INVENTOR(S) : Yuki Oshita It is certified that error appears in the above-identified patent and that said Letters Patent is hereby corrected as shown below:

In the Claims

Column 9, Claim 4, Line 28 should read:
timepiece is equal to or lower than the

Signed and Sealed this
Twenty-second Day of August, 2023

Katherine Kelly Vidal
*Director of the United States Patent and Trademark Office*